(12) United States Patent
Murata et al.

(10) Patent No.: US 7,765,936 B2
(45) Date of Patent: Aug. 3, 2010

(54) TRANSPORTING SYSTEM WITH FIRE DOOR, RAIL APPARATUS WITH FIRE DOOR, AND TRANSPORTING SYSTEM

(75) Inventors: Masanao Murata, Ise (JP); Senzou Kyutoku, Ise (JP); Toshio Takasu, Ise (JP)

(73) Assignee: Muratec Automation Co., Ltd., Kyoto-Shi (JP)

( * ) Notice: Subject to any disclaimer, the term of this patent is extended or adjusted under 35 U.S.C. 154(b) by 134 days.

(21) Appl. No.: 12/055,338

(22) Filed: Mar. 26, 2008

(65) Prior Publication Data

US 2008/0236047 A1     Oct. 2, 2008

(30) Foreign Application Priority Data

Mar. 28, 2007   (JP) .............................. 2007-085340

(51) Int. Cl.
*B61B 1/00* (2006.01)
(52) U.S. Cl. .................... 104/307; 104/88.01; 104/106; 238/230; 246/304; 246/375; 246/454; 454/257; 454/369
(58) Field of Classification Search ............. 104/88.01, 104/106; 105/18; 238/230; 246/169, 170, 246/257, 304, 305, 369, 375, 276, 454, 465, 246/468, 469, 376; 454/169, 170, 257, 369
See application file for complete search history.

(56) References Cited

U.S. PATENT DOCUMENTS

| 1,743,559 | A | * | 1/1930 | McGrew | ..................... 238/237 |
| 5,642,767 | A | * | 7/1997 | Nair | .............................. 160/8 |
| 5,842,637 | A | * | 12/1998 | Lanzer | ........................ 238/152 |

FOREIGN PATENT DOCUMENTS

| JP | 01-166819 | 6/1989 |
| JP | 08-070566 | 3/1996 |
| JP | 2003-160047 | 6/2003 |

* cited by examiner

*Primary Examiner*—S. Joseph Morano
*Assistant Examiner*—Zachary Kuhfuss
(74) *Attorney, Agent, or Firm*—Young & Thompson

(57) ABSTRACT

A transporting system with a fire door (100) is provided with: a rail (1) installed within a facility; a transporting carriage (3), whose wheel (4) is set so as to roll over a surface for rolling of the rail; a fire door plate (7) for segmenting a space within the facility in a direction intersecting the rail at a predetermined position of the rail; and a door plate moving device (8) capable of moving the fire door plate from an open position for the transporting carriage to pass through the predetermined position, to a close position for the fire door plate to segment the space. A first cut (1*a*) is formed obliquely with respect to a width direction of the rail when planarly seen on the surface for rolling, in the rail at the predetermined position. The fire door plate has a shape capable of passing through the first cut when being moved to the close position.

14 Claims, 7 Drawing Sheets

TRANSPORTING SYSTEM WITH FIRE DOOR, RAIL APPARATUS WITH FIRE DOOR, AND TRANSPORTING SYSTEM

BACKGROUND OF THE INVENTION

1. Field of the Invention

The present invention relates to a transporting system in which a transporting carriage for transporting various objects, goods, cargos, carriers etc., travels on a rail within a facility such as a factory, a warehouse or the like. The present invention especially relates to such a transporting system with a fire door. The present invention further related to a rail apparatus with the fire door, which is included in the transporting system with the fire door. In the present invention, the "object, good, cargo or carrier" transported by the transporting system means a product, an intermediate product, a part, an article, a work, a partly-finished good, a good or the like (e.g, a semiconductor or LCD device), or means a box or container for containing such a product or the like (e.g, a container containing the semiconductor or LCD device), which has been transported or is to be transported by the transporting carriage.

2. Description of the Related Art

As this kind of transporting system, there is a transporting system in which a transporting carriage, such as a so-called "vehicle" or the like, travels on a rail installed on or near the ceiling or floor in the factory etc., for example. Here, since a wheel of the transporting carriage rolls over a surface for rolling of the rail, a cut, chasm or discontinuity in the rail becomes a cause of vibration of the transported object, a cause of noise etc., during the transportation. Therefore, conventionally, in Japanese Patent Application Publication Laid Open No. Hei. 1-166819 or 2003-160047, such a technique is proposed that the total number of wheels is increased and thus the number of wheels rolling over the surface for rolling, where the cut does not exist, is increased at each instant. By this, a harmful influence due to the fact that the wheel is dropped into the cut is diminished. In Japanese Patent Application Publication Laid Open No. Hei. 8-70566, such a technique is proposed that, by use of a Linear motor having more than three armatures, the pitch of the magnets arranged along the rail and the pitch of the electrode pattern of the armatures are matched with each other.

Since there is a certain fear of fire depending upon the kind of the transported carriage especially in the factory or the like, a fire door is equipped at the vicinity of the rail in this kind of transporting system, so that the space within the facility where the rail is installed can be appropriately segmented. The fire door is generally evacuated or cleared to a position where the fire door does not interfere the transportation in an ordinary condition, and air-tightly segments the space within the facility as the occasion demands (i.e., in case of fire).

SUMMARY OF THE INVENTION

However, according to the above described conventional technologies, since it is required to modify the basic structure of the transporting carriage such as the increase of the number of wheels, armatures etc., there arises a problem that the apparatus structure as well as the control thereof would be too sophisticated.

Additionally, in order to segment the space within the facility in an airtight manner, there are expected to be many cases where the fire door is shut across the rail. However, if the cut, chasm or discontinuity is formed to the rail, it is very difficult for the above described technologies to deal with this cut, considering its size, which is large enough for the fire door to pass through.

It is therefore an object of the present invention to provide (i) a transporting system with a fire door, which can segment the space within the facility by the fire door across the rail while reducing the harmful influence onto the traveling capability or performance of the transporting carriage, (ii) a rail apparatus with the fire door, which is installed in such a transporting system, and (iii) a transporting system, in which the cut, chasm or discontinuity is formed to the rail while restricting the harmful influence thereof.

The above object of the present invention can be achieved by a transporting system with a fire door provided with: a rail installed within a facility; a transporting carriage, whose wheel is set to roll over a surface of said rail a fire door plate for segmenting a space within the facility in a direction intersecting said rail at a predetermined position of said rail; and a door plate moving device capable of moving said fire door plate from an open position for said transporting carriage to pass through the predetermined position, to a close position for said fire door plate to segment the space, a first cut being formed obliquely with respect to a width direction of said rail when planarly seen on the surface for rolling, in said rail at the predetermined position, said fire door plate having a shape capable of passing through said first cut when being moved to said close position.

According to the transporting system with the fire door of the present invention, the rail is installed on or near the ceiling, the floor etc., within the facility such as a factory, a warehouse or the like. On the rail, the transporting carriage is set. As the wheel of the transporting carriage rolls over the surface for rolling of the rail, the transporting carriage travels on the rail, at an ordinary occasion with no fire. This kind of traveling operation is performed by an electro-magnetic driving force between the linear motor mounted on the transporting carriage and the permanent magnets arranged along the rail, for example. Alternatively, it may be performed by other electro-magnetic or, electric or mechanical driving force. At this occasion, the fire door plate is in such an open position that the transporting carriage can pass through. Thus, the fire door plate does not interrupt the traveling operation of the transporting carriage.

Here especially, the first cut formed in the rail which enables the segmentation of the space within the facility by the fire door plate as described later is formed obliquely with respect to the width direction of the rail when planarly seen on the surface for rolling, on which the wheel rolls over. Therefore, in comparison with the case that the cut is parallel to the width direction of the rail, it is possible to reduce quite efficiently the amount that the wheel drops into a cut, chasm or discontinuity in the rail due to the existence of the first cut. Thus, even if there is the first cut, it is possible to reduce or prevent the sidetrack or run off of the transporting carriage, the vibration of the transported object or carrier, the noise etc., while traveling. Further, this leads to the prevention of the generation of dust or failure due to the cut of the rail.

On the other hand, in case of fire, the fire door plate is moved to such a closed position that the space within the facility is segmented, from the aforementioned open position, by virtue of the door plate moving device provided with an actuator, which drives the fire door plate electrically, electromagnetically, mechanically etc., for example. Then, since the fire door plate passes through the first cut formed in the rail, the space within the facility is segmented, by virtue of the fire door plate, in the direction intersecting the rail at the predetermined position of the rail where the fire door plate is equipped. Namely, since the fire door plate has the shape complementary to the first cut and thus can pass through the first cut, the fire door plate in the close position and the rail do not interfere with each other. As a result, it is easily possible to air-tightly segment the space within the facility by the fire door plate, although the direction of segmenting is the direction intersecting the rail.

As described above, according to the transporting system with the fire door, it is possible to segment the space within the facility in the direction intersecting the rail by the fire door while reducing the harmful influence onto the traveling capability or performance of the traveling carriage.

In one aspect of the transporting system with the fire door of the present invention, the transporting system further comprises a plurality of magnets arranged discretely along said rail, said wheel rolling by a driving force, which is generated by use of said plurality of magnets, said fire door plate having a shape capable of passing through a gap between said plurality of magnets in addition to said first cut when being moved to said close portion.

According to this aspect, at an ordinary occasion, the transporting carriage travels by the linear motor method by use of the magnet. In case of fire, the fire door plate is moved from the open position to the close position as passing though the gap between the magnets. In this manner, although the magnets are arranged along the rail, since the fire door plate has the shape complementary to the gap of between the magnets, the magnets does not become an obstacle upon closing the fire door.

In another aspect of the transporting system with the fire door of the present invention, said fire door plate comprises a first plate portion which is formed obliquely in correspondence with said first cut and a second plate portion which is formed in correspondence with the gap when planarly seen on the surface for rolling, said first plate portion and said second plate portion being integrally connected to each other.

According to this aspect, when the fire door plate is moved to the close position, the first plate portion passes through the first cut and the second plate portion passes through the gap. In this manner, since the fire door plate comprises the integrated first and second plate portions and is formed in the complementary shape with respect to the first cut and the gap, it is possible to surely segment the space within the facility in the direction intersecting the rail by the fire door, by virtue of the fire door plate having a relatively simple structure.

In another aspect of the transporting system with the fire door of the present invention, said rail comprises a pair of rail portions, and a pair of cuts are formed as said first cut in said pair of rail portions respectively, and are oblique in a direction reverse to each other when planarly seen on the surface for rolling.

According to this aspect, a pair of cuts as the first cut are oblique or inclined in the reverse direction with each other, when planarly seen on the surface for rolling. Thus, it is possible to surely segment the space within the facility in the direction intersecting the rail by the fire door, by virtue of the fire door plate having the line-symmetric shape or the shape similar to the line-symmetric shape, with respect to the central line of the rail as the symmetric axis when planarly seen on the surface for rolling.

In another aspect of the transporting system with the fire door of the present invention, said rail comprises a pair of rail portions, and a pair of cuts are formed as said first cut in said pair of rail portions respectively, and are oblique in a direction similar to each other when planarly seen on the surface for rolling.

According to this aspect, a pair of cuts identified as the first cut are oblique or inclined in the same direction to each other, when planarly seen on the surface for rolling. Thus, it is possible to surely segment the space within the facility in the direction intersecting the rail by the fire door, by virtue of the fire door plate having the line shape or the shape similar to the line, when planarly seen on the surface for rolling.

In another aspect of the transporting system with the fire door of the present invention, the surface for rolling is disposed in a groove of said rail.

According to this aspect, the cross section of the rail cross-sectioned in the width direction of the rail is formed in the U shape for example. On the bottom face of the groove in this U shape, a plurality of magnets is arranged along the traveling direction. This bottom face at both sides of the magnet is the surface for rolling, over which the wheel rolls. By constituting the rail in this type, the wheel and the peripheral of the wheel as well as the magnets are surrounded by the rail, so that those can be kept in a constant or stable balance or attitude. Thus, as compared with the case that those are not surrounded by the rail, it is possible to reduce the vibration of the transported object, the vibration etc., when traveling on the first cut.

In another aspect of the transporting system with the fire door of the present invention, an angle that said first cut is formed obliquely is set on the basis of a width of said wheel and a width of said first cut.

According to this aspect, since the angle of the first cut is corresponding to the width of the wheel and the width of the first cut, it is possible to quite efficiently reduce the amount that the wheel drops into the cut, chasm or discontinuity of the rail. Typically, the oblique angle is set on the basis of the width of the wheel and the width of the first cut so that the whole area as for the width direction of the wheel may not substantially drop into the first cut at the same instant. Then, as for each wheel rolling over the rail, the height of the wheel on the rail is hardly changed even when passing through the cut. Thus, the smooth passing operation is enabled. Incidentally, the oblique angle may be set on the basis of the area contacting the surface for rolling of the wheel, in addition to the width of the wheel and the width of the first cut.

In this aspect, the angle may be set so that a whole area in the width direction of the wheel may not drop in said first cut at an instant.

By constructing in this manner, since the oblique angle is set such that the whole area as for the width direction of the wheel does not drop into the first cut at the same instant, as for each wheel rolling over the rail, the contacting surface of the wheel bridges or strides over the sides of the cuts even when passing through the cut. Accordingly, the height of the wheel on the rail is not changed even when passing through the cut, and thus, the very smooth passing operation is enabled.

In another aspect of the transporting system with the fire door of the present invention, the transporting system further comprises a plurality of magnets arranged discretely along said rail, said wheel rolling by a driving force, which is generated by use of said plurality of magnets, a second cut being formed obliquely with respect to the width direction of said rail when planarly seen on the surface for rolling, in said plurality of magnets at the predetermined position, said fire door plate having a shape capable of passing through said second cut in addition to said first cut when being moved to said close portion.

According to this aspect, the second cut is formed obliquely with respect to the width direction of the rail in the magnet, which is positioned where the space within the facility is segmented, so that the fire door plate can pass through the second cut in addition to the first cut, when being moved to the close position. Therefore, there is no more restriction or constraint that the fire door plate should pass through the gap of the magnets. In other wards, since the fire door plate can be moved regardless of the arrangement of the magnets, the degree of freedom in design can be increased.

In this aspect, said first cut and said second cut are arranged on one straight line when planarly seen on the surface for rolling, and said fire door plate comprises one piece of flat plate, at a portion thereof which passes through said first cut and said second cut.

By constructing in this manner, the first and second cuts are arranged on one straight line while the fire door plate, which passes through the first and second cuts, comprises one piece of flat plate. Thus, the fire door plate can be moved in the up and down direction and/or the left and right direction, along the direction parallel to the surface for rolling from the lateral side of the rail or along the normal line of the surface for rolling from the front side or back side of the rail. Therefore, the fire door plate in the open position can be disposed freely in harmonization with the space within the facility.

In the above aspect in which the second cut is formed, the plurality of magnets may be arranged at a predetermined pitch, and one magnet, in which the second cut is formed, among the plurality of magnets may be increased in a magnetic force per unit volume, as compared with other magnets, in which the second cut is not formed.

By constructing in this manner, since the magnetic force per unit volume of the magnet in which the second cut is formed is increased, the electro-magnetic driving force by the linear motor can be prevented from being locally reduced due to the second cut. Thus, it is possible for the transporting carriage to easily travel at a constant traveling speed over the second cut.

In another aspect of the transporting system with the fire door of the present invention, said door plate moving device moves said fire door plate along a normal direction of the surface for rolling from a front surface side or a back surface side of said rail.

According to this aspect, since the fire door plate is moved along the normal direction of the surface for rolling from the front side or back side of the rail, it is possible to efficiently utilize a spare or extra space in the space within the facility, which has the space for the fire door plate in the open position, on the front side or back side of the rail. At this occasion especially, if a cut having an appropriate shape when planarly seen on the surface for rolling is formed, as long as the appropriate shape is corresponded by the shape of the fire door plate, it is possible to open and close the fire door.

In the above aspect in which the second cut is formed, said door plate moving device may move said fire door plate along a direction parallel to the surface for rolling from a lateral side of said rail.

By constructing in this manner, since the fire door plate is moved along the direction parallel to the surface for rolling from the lateral side of the rail, it is possible to efficiently utilize a spare in the space within the facility, which has the space for the fire door plate in the open position, on the lateral side of the rail i.e., the transporting path respectively. At this occasion especially, the fire door plate can be moved without such a restriction or constraint that the movement is limited to the normal direction of the surface for rolling. Thus, the degree of freedom in disposing the fire door plate is certainly increased, which is quite beneficial in the practical sense.

The above object of the present invention can be achieved by a rail apparatus with a fire door provided with: a rail installed within a facility, on which a wheel of a transporting carriage is set so as to roll over a surface for rolling of said rail; a fire door plate for segmenting a space within the facility in a direction intersecting said rail at a predetermined position of said rail; and a door plate moving device capable of moving said fire door plate from an open position for said transporting carriage to pass through the predetermined position, to a close position for said fire door plate to segment the space, a first cut being formed obliquely with respect to a width direction of said rail when planarly seen on the surface for rolling, in said rail at the predetermined position, said fire door plate having a shape capable of passing through said first cut when being moved to said close position.

According to the rail apparatus with the fire door of the present invention, by setting the transporting carriage on the rail, in the same manner as the above described transporting system with the fire door of the present invention, it is possible to segment the space within the facility by the fire door in the direction intersecting the rail, while reducing the harmful effect onto the traveling capability or performance of the transporting carriage.

Incidentally, in the rail apparatus with the fire door of the present invention, various aspects same as those in the above described transporting system with the fire door of the present invention can be also adopted.

The above object of the present invention can be achieved by a transporting system provided with: a rail installed within a facility; and a transporting carriage, whose wheel is set so as to roll over a surface for rolling of said rail, a first cut being formed obliquely with respect to a width direction of said rail when planarly seen on the surface for rolling, in said rail at the predetermined position.

According to the transporting system of the present invention, as the first cut is formed obliquely with respect to the width direction of the rail, it is possible to quite efficiently reduce the amount that the wheel drops into the cut of the rail, in the same manner as the case of the above described transporting system with the fire door of the present invention. The "first cut" in the transporting system of the present invention is typically a cut for the fire door plate to pass through it. However, the present invention is not limited to this, and the first cut may be a cut for any plate or member to pass through it. Further, the cut may be formed at the joint portion of the rail when constructing the rail, and the width of the cut may be narrow or very narrow. In an extreme case, the end faces of the rail may be adhered, bonded or closely contacted to each other. In any event, since the cut is oblique in the presence of the cut, it is possible to reduce or prevent the sidetrack or run off of the transporting carriage, the vibration of the transported object or carrier, the noise etc., while traveling.

Incidentally, in the transporting system of the present invention, various aspects similar to those in the above described transporting system with the fire door of the present invention can be also adopted.

The nature, utility, and further features of this invention will be more clearly apparent from the following detailed description with respect to preferred embodiments of the invention when read in conjunction with the accompanying drawings briefly described below.

DETAILED DESCRIPTION OF THE PREFERRED EMBODIMENTS

Referring to the accompanying drawings, embodiments of the present invention will be now explained.

First Embodiment

Figure 1:
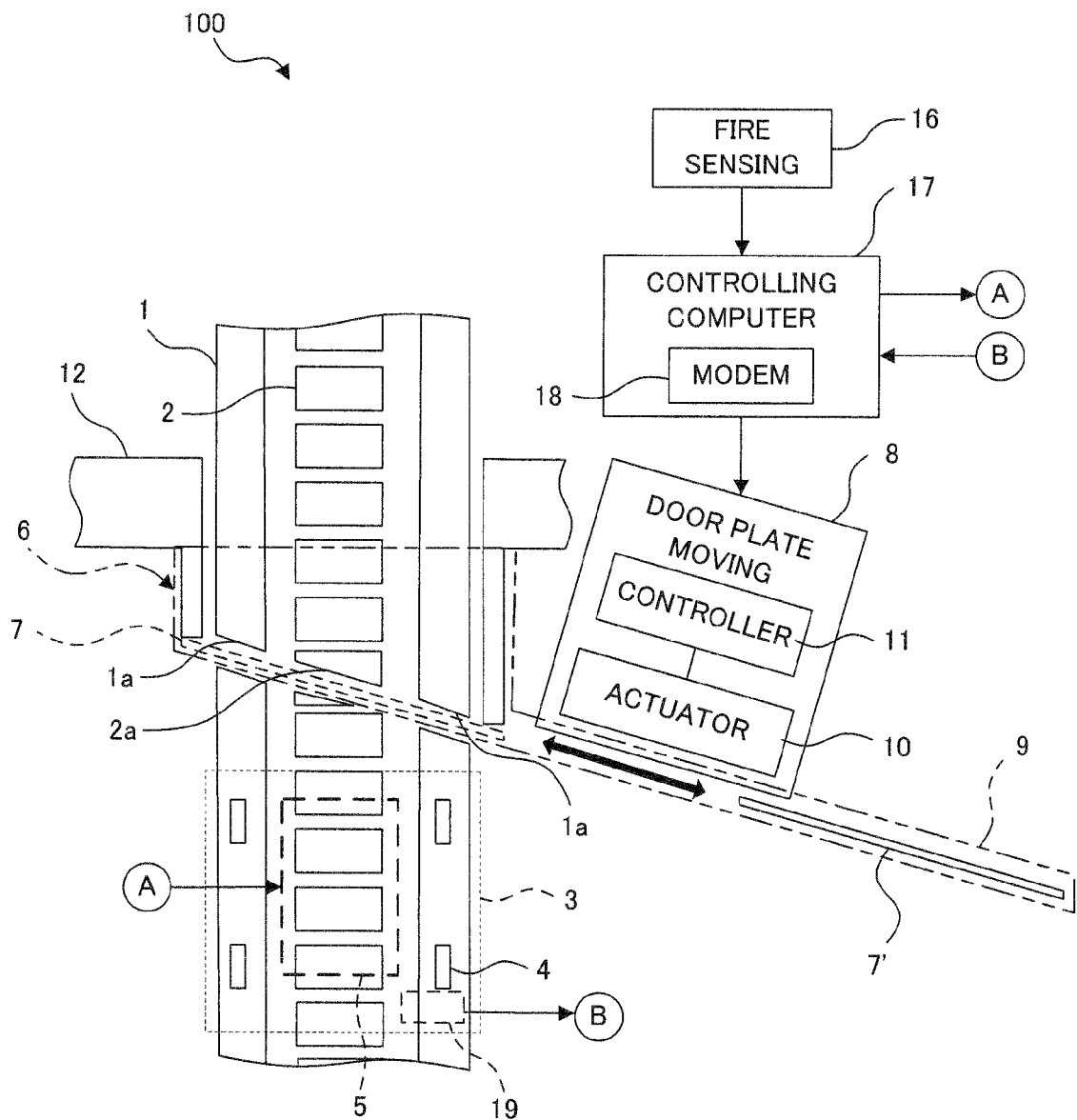
FIG. 1 is a schematic plan view of a transporting system with a fire door as a first embodiment of the present invention.

At first, a structure of a transporting system with a fire door in the first the embodiment is explained with referring to FIG. 1 as well as FIG. 2A to FIG. 4B. FIG. 1 schematically shows the transporting system with the fire door. Each of FIG. 2A to FIG. 4B planarly shows the rail near the cut of the transporting system, in closeup.

In FIG. 1, the transporting system with the fire door 100 is mainly provided with a rail 1, a vehicle 3 and a fire door apparatus 6.

As shown in FIG. 1, the rail 1 comprises a pair of rails, each extending in a traveling direction (i.e., the up and down direction in FIG. 1) and having a surface for rolling on which a wheel 4 of the vehicle 3 rolls over. Further, the rail 1 comprises a plurality of permanent magnets 2 arranged in the traveling direction between the pair of rails. The permanent magnets 2 are one example of "a plurality of magnets" of the present invention, and constitute a secondary side of the linear motor. The rail 1 serves as a traveling path, on which the primary side of the linear motor 5 equipped on the vehicle 3 travels in one body with the transporting carriage. A control wire line or lines, through which (i) a power signal or signals for the vehicle 3 to travel and (ii) various control signals to control the travel are sent and received, are also equipped in one body with or along the pair of rails. The rail 1 is installed within a facility such as a factory, a warehouse or the like.

In the rail 1, a cut 1a is formed as one example of "a first cut" of the present invention, at each of predetermined positions of the rail 1. The cut 1a is formed so as to obliquely intersect with respect to the width direction of the rail 1 when planarly seen on the surface for rolling.

Figure 2A:
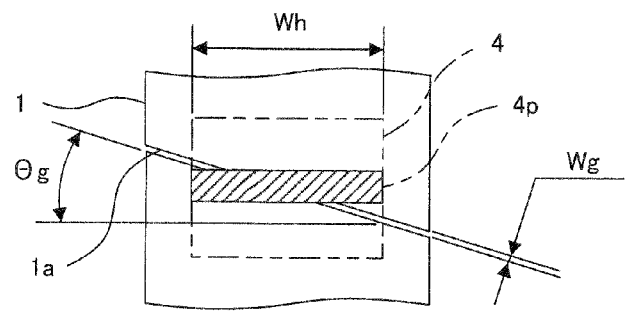
FIG. 2A is a schematic plan view showing a contact condition of a wheel with respect to a rail with a cut in the first embodiment.
Figure 2B:
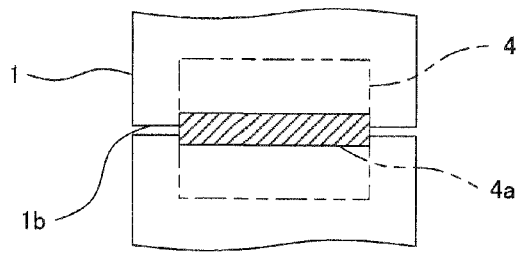
FIG. 2B is a schematic plan view showing a contact condition of a wheel with respect to a rail with a cut in one comparison example.

As shown in FIG. 2A, the width Wg and the angle θ g of the cut 1a are determined on the basis of the value of the width Wh of the wheel 4, in such a manner that the whole area of the contacting surface 4p, which elongates in the width direction, of the wheel 4 may not drop into the cut 1a at the same instant. Namely, the width Wg and the angle θ g of the cut 1a are determined on the basis of the value of the width Wh of the wheel 4, so that one portion in the width direction of the wheel 4, which rolls while contacting at the contacting surface 4p having the width Wh and having only a subtle length in the traveling direction, may not simultaneously get caught in the cut 1a at any instant. Then, the height of the wheel 4 rolling over the rail 1 is kept constant when passing through the cut 1a, and thereby it is possible to smoothly pass, for each of the wheels 4. If the cut 1a is not oblique, as in the case of a comparison example shown in FIG. 2B, an instant at which the whole area in the width direction of the wheel 4 drops into the cut 1b certainly exists. Thus, when passing through the cut 1b, the vibration etc., is more or less generated in the wheel 4.

Figure 3A:
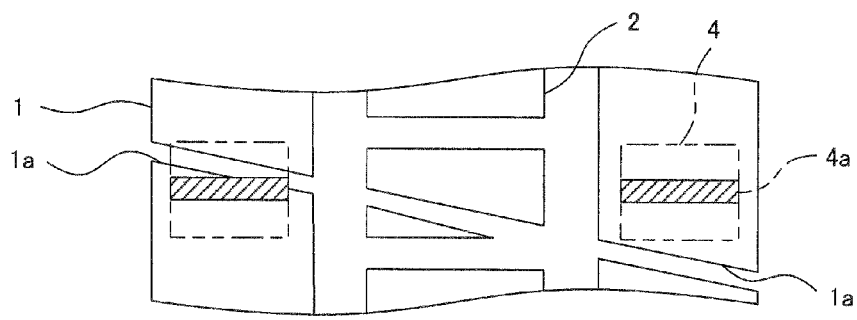
FIG. 3A is a schematic plan view showing one example of contact conditions of a pair of wheels with respect to a rail with a cut in the first embodiment.
Figure 3B:
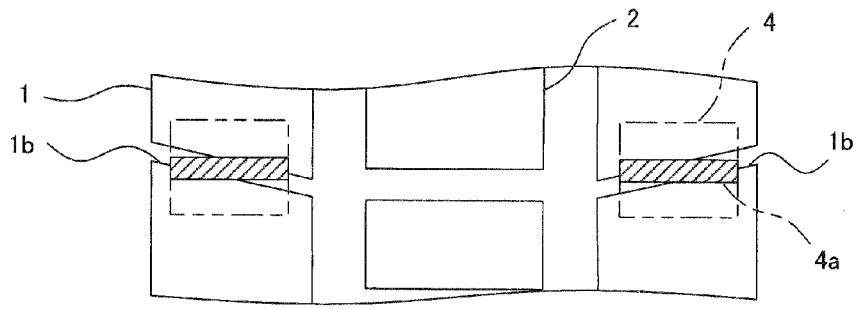
FIG. 3B is a schematic plan view showing another example of contact conditions of a pair of wheels with respect to a rail with a cut in the first embodiment.

As shown in FIG. 3A, it is preferred for a pair of wheels 4, which are opposed to each other across the permanent magnet 2 in the direction orthogonal to the traveling direction, not to simultaneously pass the cut 1a, from a view point of restraining the generated noise. Namely, the cut 1a is preferably different in position in the traveling direction from each other between the pair of rails. If the cut 1a is in the same position in the traveling direction between the pair of rails, as in the case of an example shown in FIG. 3B, the pair of wheels 4 opposed to each other in the direction orthogonal to the traveling direction simultaneously pass the cut 1b. Thus, when passing through the cut 1b, the vibration etc. of the wheels 4 becomes greater. In the example shown in FIG. 1, such a preferable positional relationship is clearly satisfied.

Figure 4A:
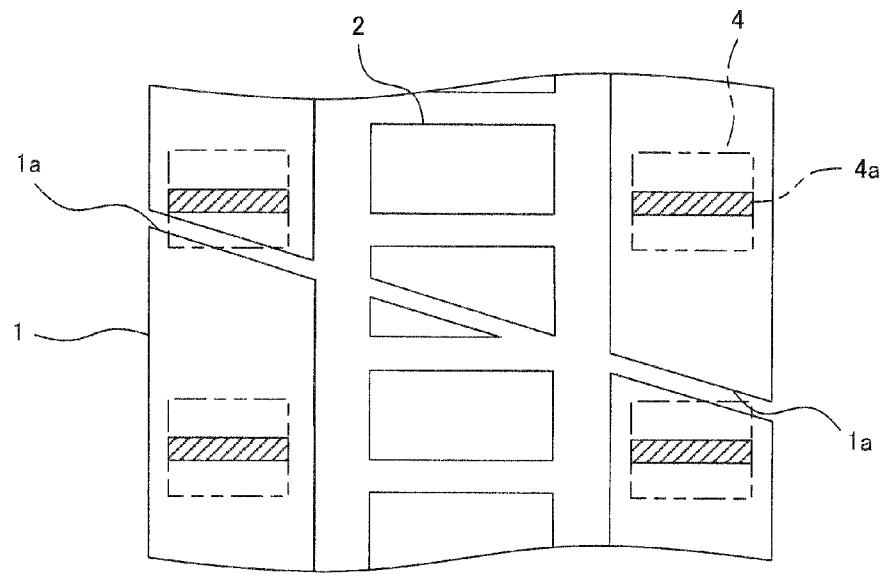
FIG. 4A is a schematic plan view showing another example of contact conditions of four wheels with respect to a rail with a cut in the first embodiment.
Figure 4B:
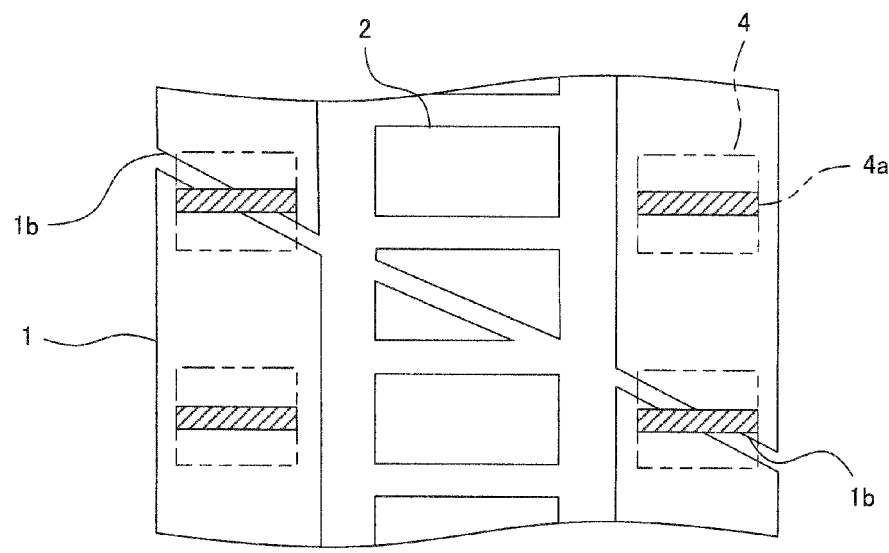
FIG. 4B is a schematic plan view showing another example of contact conditions of four wheels with respect to a rail with a cut in the first embodiment.

As shown in FIG. 4A, it is further preferred for a pair of wheels 4, which are opposed to each other across the permanent magnet 2 in the direction oblique to the traveling direction, not to simultaneously pass the cut 1a, from a view point of restraining the generated noise. Namely, the distance along the traveling direction between the cut 1a formed in one rail and the cut 1a formed in another rail is preferably different from the distance between the successive wheels 4 on the same rail. If the distance along the traveling direction between the cut 1a formed in one rail and the cut 1a formed in another rail is the same as the distance between the successive wheels 4 on the same rail, as in the case of an example shown in FIG. 4B, the pair of wheels 4 opposed to each other in the direction oblique to the traveling direction simultaneously pass the cut 1b. Thus, when passing through the cut 1b, the vibration etc. of the wheels 4 becomes greater. In the example shown in FIG. 1, such a preferable positional relationship is clearly satisfied.

As explained with referring to FIG. 2A to FIG. 4B, the width Wg and the angle θ g of the cut 1a are preferably determined on the basis of (i) the width Wh of the wheel 4 and (ii) the span or distance of the pair of wheels 4, so that one portion in the width direction of the wheel 4, which rolls over while contacting at the contacting surface 4p having the subtle length in the traveling direction, may not simultaneously get caught in the cut 1a at any instant, as for each of the wheels 4. Further, the width Wg and the angle θ g are preferably determined on the basis of the span or distance of the wheels 4 so that a plurality of wheels 4 may not simultaneously get caught in the cut 1a (refer to FIG. 3A to FIG. 4B)

As shown in FIG. 1 again, a cut 2a as one example of "a second cut" of the present invention is formed at each of predetermined positions in the permanent magnets 2. The cut 2a is formed so as to intersect obliquely with respect to the width direction of the rail 1 when planarly seen on the surface for rolling. The cut width of the cut 2a corresponds to the thickness of the plate portion of the fire door apparatus 6 described later in detail. The cut 2a of the permanent magnet 2 and the cut 1a of the rail 1 are arranged on one straight line when planarly seen on the surface for rolling. By arranging in this manner, the plate portion 7 can be engaged with the cut 1a and the cut 2a, not only from the normal line of the surface for rolling of the rail 1 but also from the left and right direction i.e., the side direction shown in FIG. 1 or the like. Nevertheless, even if the cut 1a and the cut 2a are not arranged on one straight line as shown in FIG. 1 (refer to the second embodiment described later), at least the movement along the normal line of the surface for rolling of the rail 1 (i.e., in the perpendicular direction to the sheet surface of FIG. 1) is still possible.

In case that the magnetic force per unit volume at the portion where the cut 2a is not formed is mg1 [A/m$^3$], the magnetic force at the portion where the cut 2a is formed is set to mg2 [A/m$^3$], which is increased in comparison with the case that the cut 2a is not formed (i.e., mg1 [A/m$^3$]<mg2 [A/m$^3$]). By constituting in this manner, it is possible to prevent the reduction in the magnetic force due to the existence of the cut 2a. Ideally, the magnetic force at the portion of the magnet 2 where the cut 2a is formed is increased, so that the magnetic force can be kept constant along the rail 1 regardless of the existence of the cut 2a. However, if the reduction in the magnetic force due to the existence of the cut 2a is small enough to give no harmful influence onto the driving operation of the linear motor related to the vehicle 3 in a practical sense, it is not necessary to use the magnets whose magnetic forces are different from each other.

The vehicle 3, as one example of the "transporting carriage" of the present invention, transports the transported object, which may be a container of various substrates for the semiconductor device production etc., by holding the transported object by virtue of a hoist structure, a robot arm and so forth. The vehicle 3 is set so that four wheels 4 in total comprising left two and right two wheels can be roll over the surface for rolling of the rail 1. The vehicle 3 travels along the rail 1 by the linear motor 5. The vehicle 3 is internally provided with a controller (not illustrated) and a positional information transmitter 19. The controller controls the operation of the vehicle 3 itself as for traveling and holding. The positional information transmitter 19 outputs a positional signal indicating the positional information within the facility. The positional transmitter 19 transmits the positional signal in response to a predetermined signal for example.

The fire door apparatus 6 is provided with: a plate portion 7 as one example of the "fire door plate" of the present invention; a housing portion 9 for accommodating the plate portion 7 in a manner of the accommodating portion of a storm window for example; and a door plate moving portion 8 as one example of the "door plate moving device" of the present invention. The plate portion 7 comprises one piece of flat plate, whose thickness is thinner than the width of each of the cut 1a and the cut 2a with a certain margin so that the plate portion 7 can pass through the cut 1a and the cut 2a when moving along the surface of the plate portion 7. The plate portion 7 is engaged with a pair of cuts 1a of the rail 1 and the cut 2a of the permanent magnet 2 when segmenting the space within the facility.

The door plate moving portion 8 as one example of the "door plate moving device" of the present invention is provided with: an actuator 10 and a controller 11. By the driving operation of the actuator 10, the plate portion 7 is moved from such an open position that the vehicle 3 can pass through the cut 1a of the rail 1 (the plate portion 7' in the open position is illustrated by a solid line in FIG. 1) to such a close position that the space within the facility is segmented (the plate portion 7 in the close position is illustrated by a broken line in FIG. 1). More concretely, the door plate moving portion 8 moves the plate portion 7 from the lateral side of the rail 1 in the housing portion 9 along the direction parallel to the surface for rolling. When the emergency condition such as fire etc., is cancelled or released, it is preferred to move the plate portion 7 from the close position to the open position. However, this moving operation from the close position to the open position may be performed by some force other than the actuator 10 such hand motion or the like. The plate portion 7 is engaged with the cuts 1a and the cut 2a in the close position. The main body, including the housing portion, of the fire door apparatus 6 is constructed to abut to a segmenting wall 12 which is part of the facility. Thus, when the plate portion 7 comes to the close position, the space within the facility where the rail 1 is installed is air-tightly segmented by the main body of the fire door apparatus 6 as well as the segmenting wall 12.

The fire sensing portion 16 has a sensor for sensing smoke, and senses a fire within the transporting system with the fire door 100, and outputs a fire signal, for example.

The controlling computer 17 controls each component of the transporting system with the fire door 100. The controlling computer 17 controls the controller 11 of the door plate moving portion 8 to move the plate portion 7 to the close position when the fire signal is received from the fire sensing portion 16 by sending and receiving various signals.

The controlling computer 17 has a modem 18 i.e., a transmitting and receiving device, and receives the information from the positional information transmitter 19 of the vehicle 3. The controlling computer 17 drive-controls the linear motor 5 to adjust the position of the vehicle 3 so that the vehicle 3 may not be positioned on the cut 1a on the basis of the positional signal in case of segmenting the space within the facility and that the vehicle 3 may not clash to the plate portion 7 after the plate portion 7 is moved to the close position.

Figure 5:
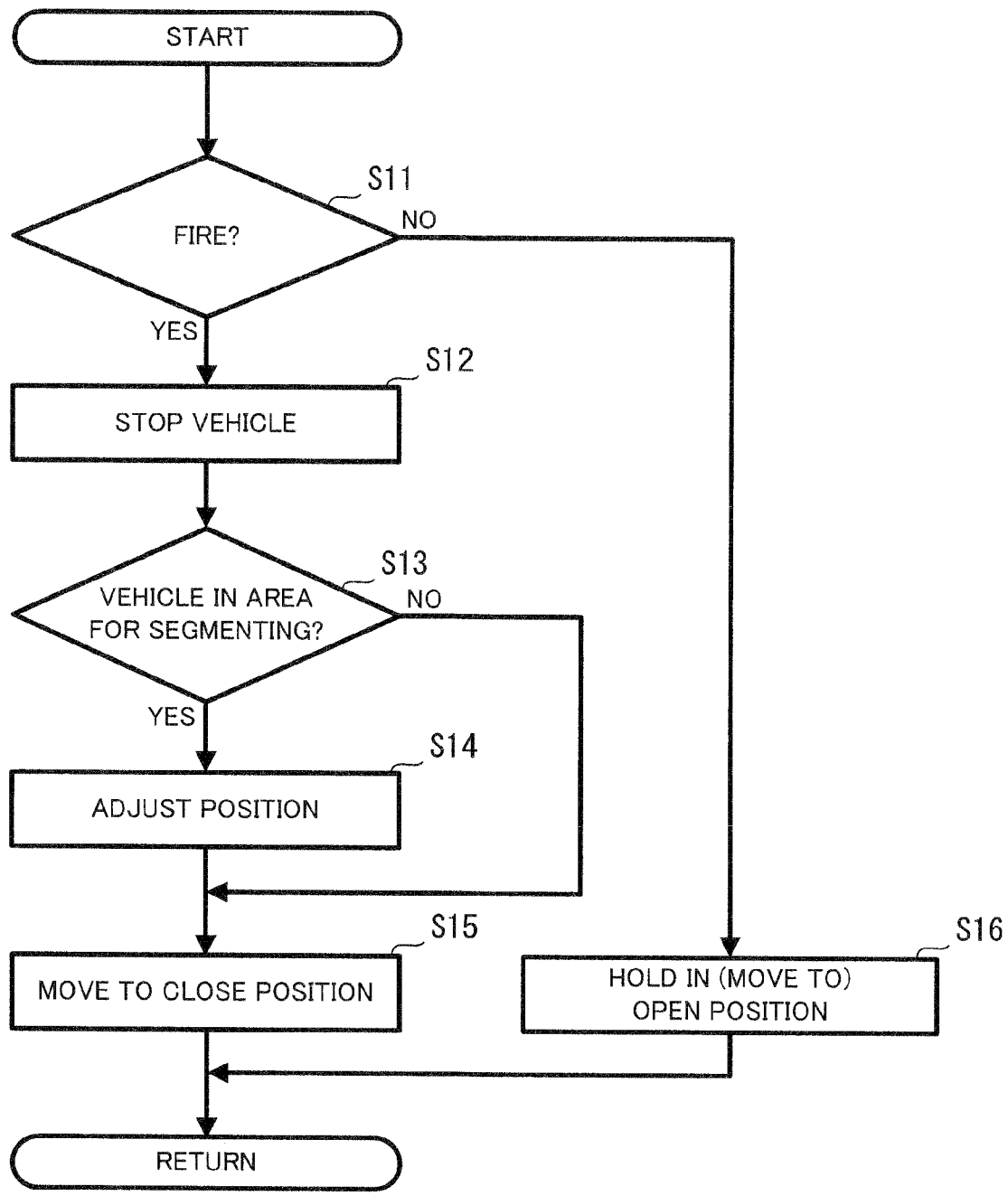
FIG. 5 is a flow chart showing an operation of the transporting system with the fire door of the first embodiment.

Next, the transporting system with the fire door of the present embodiment is explained with referring to FIG. 5 in addition to FIG. 1. FIG. 5 shows a flowchart of the operation process of the transporting system with the fire door of the present embodiment.

In FIG. 5, it is assumed that the plate portion 7 is held in the open position as the initial condition, which is not a fire or the like. In this condition, by the controlling computer 17, it is judged whether or not the fire signal is outputted from the fire sensing portion 16 (step S11). Here, as long as it is judged that the fire signal is not outputted (step S11: NO), the plate portion 7 is kept in the open position (step S16). Alternatively, after the plate portion 7 is put in the close position due to the fire, in case that the output of the fire signal is stopped, under the control of the controlling computer 17, the plate portion 7 is moved to the open position.

On the other hand, according to the judgment at the step S11, if it is judged that the fired signal is outputted (step S11: Yes), the driving operation of the linear motor 5 is stopped, and thus the traveling operation of the vehicle 3 is stopped (step S12). Next, on the basis of the positional signal from the positional information transmitter 19, which is mounted on the vehicle 3, it is judged whether or not the vehicle 3 is within the area for segmenting 20 (step S13). Here, if it is judged that the vehicle 3 is within the area for segmenting 20 (step S13: Yes), the linear motor 5 is driven so that the position of the vehicle 3 is adjusted not to exist within the area for segmenting 20 (step S14). On the other hand, if it judged that the vehicle 3 does not exist within the area for segmenting 20 (step S13: No), the positional adjustment of the vehicle 3 is not performed. Then, the actuator 10 of the door plate moving portion 8 is driven so that the plate portion 7 may be moved to the close position (step S15). At this occasion, the plate portion 7 is moved from the lateral side of the rail 1 along the direction parallel to the surface for rolling and passes through the cuts 1a and the cut 2a. By positioning the plate portion 7 completely in the close position, the space within the facility is segmented.

Incidentally, after the plate portion 7 is in the close position, the traveling operation of vehicle 3 is kept to be ceased.

In this manner, according to the transporting system with the fire door 100 in the first embodiment, it is possible to reduce the amount of dropping into the cut 1a of the wheel 4, in comparison with the case that the cut is in parallel to the width direction of the rail 1 (refer to FIG. 2B), since the cut 1a is oblique with respect to the width direction of the rail 4 when planarly seen on the surface for rolling (refer to FIG. 2A). By this, the vibration etc., generated when the vehicle 3 passes through the cut 1a can be reduced. Further, while reducing the vibration etc., in this way, it is possible to appropriately segment the space within the facility by the plate portion 7 of the fire door apparatus 6, by making the best use of the cut 1a.

Second Embodiment

Figure 6:
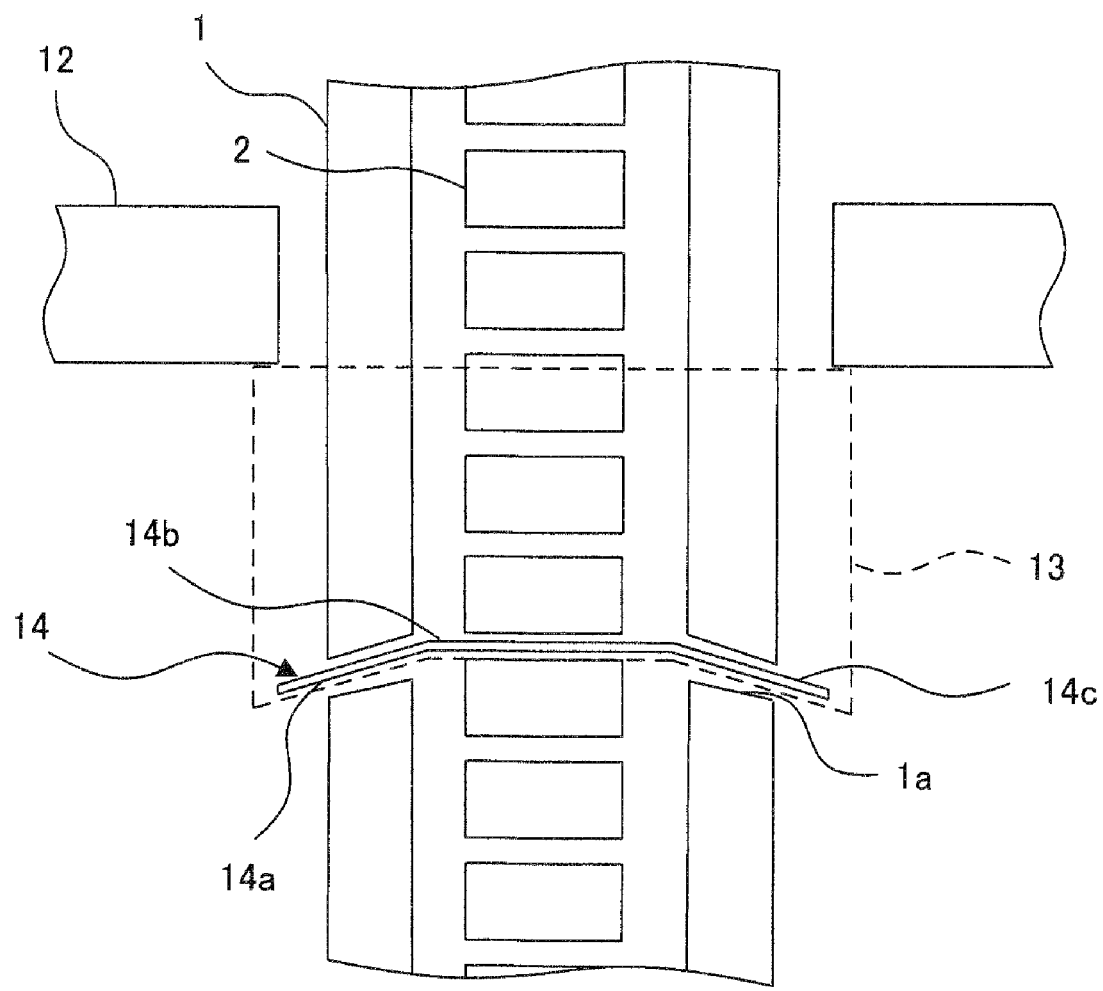
FIG. 6 is a schematic plan view of a transporting system with a fire door as a second embodiment of the present invention.
Figure 7:
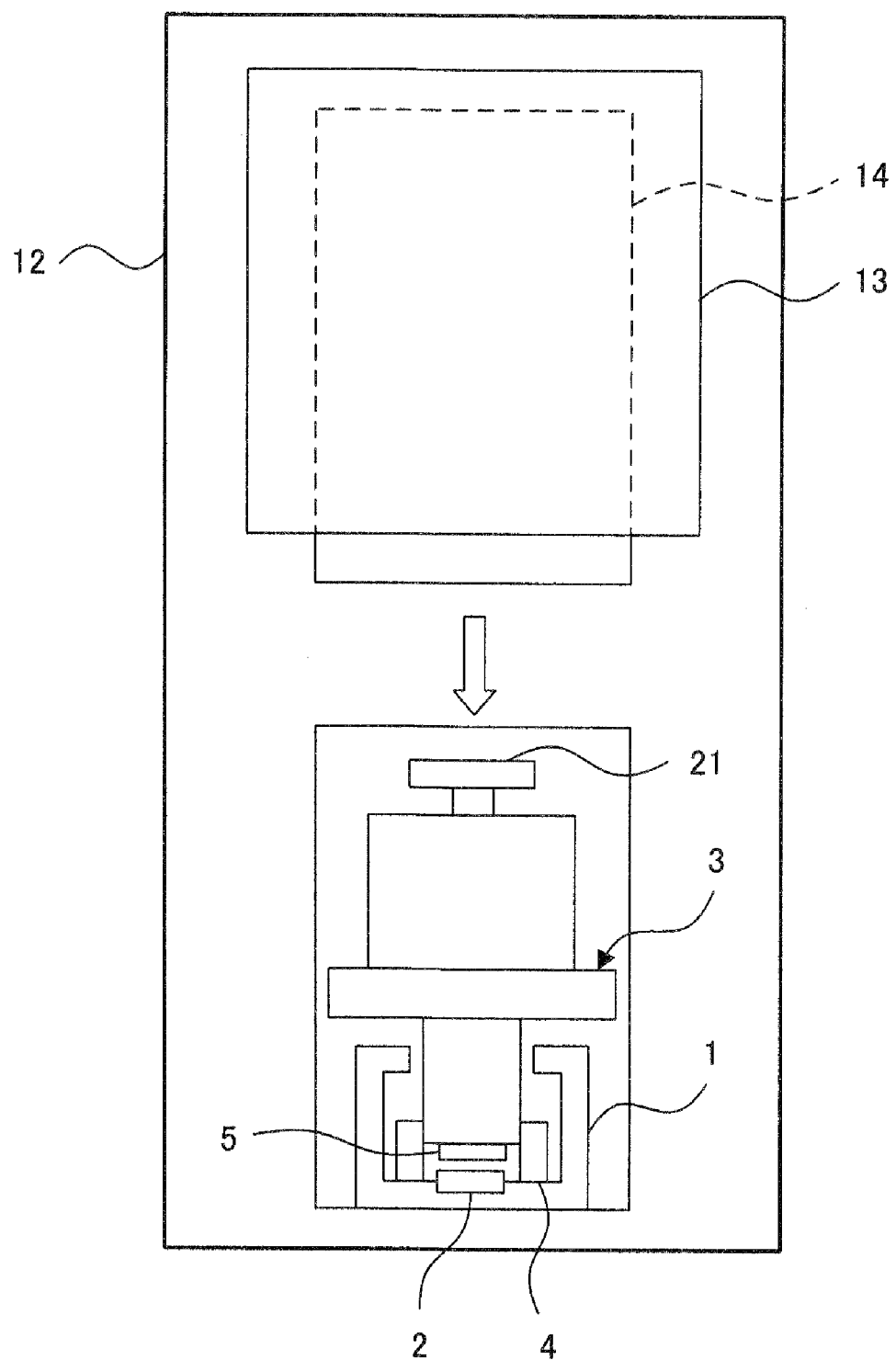
FIG. 7 is a schematic side view of a fire door in an open condition in the second embodiment.

Next, a transporting system with a fire door in the second embodiment is explained with referring to FIG. 6 and FIG. 7. FIG. 6 schematically shows the transporting system with the fire door, to the same effect of FIG. 1. FIG. 7 schematically shows the profile of the fire door apparatus. In FIG. 6 and FIG. 7, the same constitutional elements as those in the first embodiment shown in FIG. 1 carry the same reference numerals, and the explanations thereof are appropriately omitted.

In FIG. 6, the transporting system with the fire door in the second embodiment is different from the first embodiment in (i) the condition of the cuts of the rail 1 and the permanent magnet 2 and (ii) the shape of the plate portion of the fire door. Other constitutional elements are substantially the same as the first embodiment.

In the rail 1, the cuts 1a are oblique with respect to the width direction of the rail 1 and are oppositely oblique to each other when planarly seen on the surface for rolling.

A plate portion 14 of a fire door apparatus 13 comprises first plate portions 14a and 14c, and a second plate portion 14b, who are integrally connected to each other. The first plate portions 14a and 14c are formed oblique oppositely to each other in correspondence with the cuts 1a of the rail 1. The second plate portion 14b is formed straight along the width direction of the rail 1 in correspondence with the gap between the permanent magnets 2. The plate portion 14 is constructed such that the first plate portions 14a and 14c are engaged with the cuts 1a and the second plate portion 14b is engaged with the gap of the permanent magnets 2. Since no one of the permanent magnets 2 intersects with the second plate portion 14b, it is necessary to form the cut to any one of the permanent magnets 2. Namely, the trouble of forming the cut into the permanent magnet 2 as in the first embodiment can be avoided, and thus a possibly harmful influence onto the operation of the linear motor due to the existence of the cut in the permanent magnet 2 can be avoided. Incidentally, in the present embodiment, the plate portion 14 is moved, not in the direction from the lateral side of the rail 1, but in the normal direction i.e., the direction perpendicular to the surface for rolling of the rail 1 (i.e., the direction perpendicular to the sheet surface in FIG. 6), which is different from the first embodiment.

As shown in FIG. 7, the transporting system with the fire door of the present embodiment is also different from the first embodiment in the above described direction of the movement of the plate portion 14. Here, FIG. 7 shows at the upper half thereof the fire door 13 in the open position and shows at the lower half thereof the vehicle 3 and the cut in the rail 1 when seen from the transporting direction where the space within the facility is not segmented.

Incidentally, in FIG. 7, the rail 1 is formed such that the profile when cross-sectioned in the width direction of the rail 1 has a U letter shape for example. The door plate moving portion 8 may move the plate portion 14 along the normal direction of the surface for rolling from the front surface side of the rail 1 for example. At this occasion, the plate portion 14 may be moved not from the front surface side but from the back surface side, along the normal direction of the surface for rolling.

In this manner, according to the transporting system with the fire door in the second embodiment, in the same manner as the first embodiment, it is possible to reduce the amount of dropping into the cut 1a of the wheel 4, in comparison with the case that the cut is in parallel to the width direction of the rail 1, since the cut 1a is oblique with respect to the width direction of the rail 4 when planarly seen on the surface for rolling. By this, the vibration etc., generated when the vehicle 3 passes through the cut 1a can be reduced. Further, while reducing the vibration etc., in this way, it is possible to appropriately segment the space within the facility by the plate portion 14 of the fire door apparatus 6, by making the best use of the cut 1a.

Figure 8:
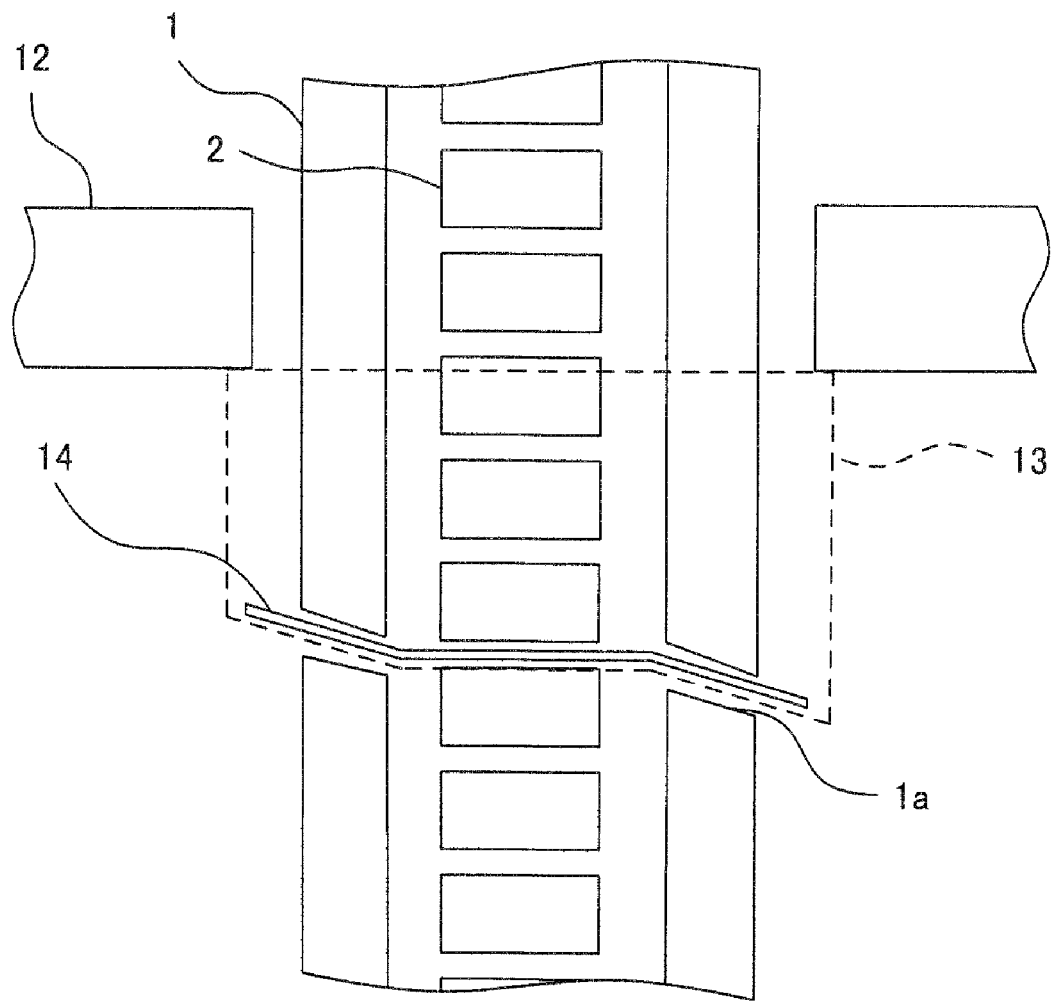
FIG. 8 is a schematic plan view of a transporting system with a fire door as a modified embodiment of the second embodiment.

Incidentally, as a modified embodiment of the second embodiment, as shown in FIG. 8, the condition of the cut in the rail 1 and the corresponding shape of the plate portion 14 may be oblique in the same direction to each other with respect to the width direction of the rail 1.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2007-85340 filed on Mar. 28, 2007 including the specification, claims, drawings and summary is incorporated herein by reference in its entirety.

What is claimed is:

1. A transporting system with a fire door comprising:
a rail installed within a facility;
a transporting carriage, whose wheel is set so as to roll over a surface for rolling of said rail;
a fire door plate for segmenting a space within the facility in a direction intersecting said rail at a predetermined position of said rail; and
a door plate moving device capable of moving said fire door plate from an open position for said transporting carriage to pass through the predetermined position, to a close position for said fire door plate to segment the space,
a first cut being formed obliquely with respect to a width direction of said rail when planarly seen on the surface for rolling, in said rail at the predetermined position,
said fire door plate having a shape capable of passing through said first cut when being moved to said close position.

2. The transporting system according to claim 1 further comprising a plurality of magnets arranged discretely along said rail,
    said wheel rolling by a driving force, which is generated by use of said plurality of magnets, said fire door plate having a shape capable of passing through a gap between said plurality of magnets in addition to said first cut when being moved to said close portion.

3. The transporting system according to claim 2, wherein said fire door plate comprises a first plate portion which is formed obliquely in correspondence with said first cut and a second plate portion which is formed in correspondence with the gap when planarly seen on the surface for rolling, said first plate portion and said second plate portion being integrally connected to each other.

4. The transporting system according to claim 1, wherein said rail comprises a pair of rail portions, and
    a pair of cuts are formed as said first cut in said pair of rail portions respectively, and are oblique in a direction reverse to each other when planarly seen on the surface for rolling.

5. The transporting system according to claim 1, wherein said rail comprises a pair of rail portions, and
    a pair of cuts are formed as said first cut in said pair of rail portions respectively, and are oblique in a direction same to each other when planarly seen on the surface for rolling.

6. The transporting system according to claim 1, wherein the surface for rolling is disposed in a groove of said rail.

7. The transporting system according to claim 1, wherein an angle that said first cut is formed obliquely is set on the basis of a width of said wheel and a width of said first cut.

8. The transporting system according to claim 7, wherein the angle is set so that a whole area in the width direction of the wheel may not drop in said first cut at an instant.

9. The transporting system according to claim 1 further comprising a plurality of magnets arranged discretely along said rail,
    said wheel rolling by a driving force, which is generated by use of said plurality of magnets,
    a second cut being formed obliquely with respect to the width direction of said rail when planarly seen on the surface for rolling, in said plurality of magnets at the predetermined position,
    said fire door plate having a shape capable of passing through said second cut in addition to said first cut when being moved to said close portion.

10. The transporting system according to claim 9, wherein said first cut and said second cut are arranged on one straight line when planarly seen on the surface for rolling, and
    said fire door plate comprises one piece of flat plate, at a portion thereof which passes through said first cut and said second cut.

11. The transporting system according to claim 9, wherein the plurality of magnets are arranged at a predetermined pitch, and
    one magnet, in which the second cut is formed, among the plurality of magnets is increased in a magnetic force per unit volume, as compared with other magnets, in which the second cut is not formed.

12. The transporting system according to claim 1, wherein said door plate moving device moves said fire door plate along a normal direction of the surface for rolling from a front surface side or a back surface side of said rail.

13. The transporting system according to claim 9, wherein said door plate moving device moves said fire door plate along a direction parallel to the surface for rolling from a lateral side of said rail.

14. A rail apparatus with a fire door comprising:
    a rail installed within a facility, on which a wheel of a transporting carriage is set so as to roll over a surface for rolling of said rail;
    a fire door plate for segmenting a space within the facility in a direction intersecting said rail at a predetermined position of said rail; and
    a door plate moving device capable of moving said fire door plate from an open position for said transporting carriage to pass through the predetermined position, to a close position for said fire door plate to segment the space,
    a first cut being formed obliquely with respect to a width direction of said rail when planarly seen on the surface for rolling, in said rail at the predetermined position,
    said fire door plate having a shape capable of passing through said first cut when being moved to said close position.

* * * * *